United States Patent
Shin et al.

(10) Patent No.: US 12,224,196 B2
(45) Date of Patent: Feb. 11, 2025

(54) SEMICONDUCTOR MANUFACTURING APPARATUS, METHOD OF READING POSITION OF CARRIER, AND METHOD OF ATTACHING SEMICONDUCTOR DIE ON CARRIER USING SEMICONDUCTOR MANUFACTURING APPARATUS

(71) Applicant: SK hynix Inc., Icheon-si (KR)

(72) Inventors: Chan Ho Shin, Icheon-si (KR); Min Kyung Kim, Icheon-si (KR); Soo Ho Jeon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 720 days.

(21) Appl. No.: 17/374,737

(22) Filed: Jul. 13, 2021

(65) Prior Publication Data

US 2022/0181181 A1    Jun. 9, 2022

(30) Foreign Application Priority Data

Dec. 8, 2020   (KR) .......................... 10-2020-0170699

(51) Int. Cl.
   *B32B 41/00*    (2006.01)
   *H01L 21/68*    (2006.01)
   (Continued)

(52) U.S. Cl.
   CPC .......... *H01L 21/681* (2013.01); *H01L 21/687* (2013.01); *H01L 24/74* (2013.01); *H01L 24/80* (2013.01)

(58) Field of Classification Search
   CPC ..... H01L 21/681; H01L 21/687; H01L 24/74; H01L 24/80; H01L 24/75; H01L 2224/75704; H01L 2224/75744; H01L 2224/75753; H01L 2224/75755; H01L 2224/759; H01L 21/68728; H01L 21/6838; H01L 21/67144; H01L 21/50; H01L 21/67294; H01L 21/67132;
   (Continued)

(56) References Cited

U.S. PATENT DOCUMENTS 8,540,001 B2    9/2013   Kihara et al.
8,836,134 B2    9/2014   Lin et al.
(Continued)

FOREIGN PATENT DOCUMENTS

JP    2020088396 A    6/2020
KR    101353685 B1    1/2014
(Continued)

*Primary Examiner* — Michael N Orlando
*Assistant Examiner* — Joshel Rivera
(74) *Attorney, Agent, or Firm* — WILLIAM PARK & ASSOCIATES LTD.

(57) ABSTRACT

A semiconductor manufacturing apparatus according to an embodiment includes a chuck configured to receive a carrier thereon, a carrier contact device configured to contact the carrier on the chuck, and a bonding head configured to transfer a semiconductor die to the carrier and configured to attach the semiconductor die on the carrier. The chuck includes a chuck reference key positioned at an edge portion thereof. The carrier contact device includes a contact position recognition key. The semiconductor manufacturing apparatus also includes a camera configured to obtaining images of the chuck reference key and the contact position recognition key.

18 Claims, 14 Drawing Sheets

(51) Int. Cl.
*H01L 21/687* (2006.01)
*H01L 23/00* (2006.01)

(58) Field of Classification Search
CPC ......... H01L 21/67259; H01L 21/67721; H01L 21/6835; H01L 21/68785
USPC .................... 156/60, 64, 350, 351, 378, 379
See application file for complete search history.

(56) References Cited

U.S. PATENT DOCUMENTS

| | | | |
|---|---|---|---|
| 2010/0139836 A1* | 6/2010 | Horikoshi | H01L 21/67092 |
| | | | 156/64 |
| 2017/0103963 A1* | 4/2017 | Sakuma | H01L 24/17 |
| 2019/0333809 A1 | 10/2019 | Kim et al. | |

FOREIGN PATENT DOCUMENTS

| KR | 1020170112890 A | 10/2017 |
|---|---|---|
| KR | 101868907 B1 | 7/2018 |
| KR | 1020180136771 A | 12/2018 |

* cited by examiner

SEMICONDUCTOR MANUFACTURING APPARATUS, METHOD OF READING POSITION OF CARRIER, AND METHOD OF ATTACHING SEMICONDUCTOR DIE ON CARRIER USING SEMICONDUCTOR MANUFACTURING APPARATUS

CROSS-REFERENCE TO RELATED APPLICATIONS

The present application claims priority under 35 U.S.C. 119(a) to Korean Application No. 10-2020-0170699, filed on Dec. 8, 2020, which is incorporated herein by reference in its entirety.

BACKGROUND

1. Technical Field

The present disclosure generally relates to a semiconductor manufacturing apparatus, a method of reading a position of a carrier, and a method of attaching a semiconductor die on a carrier using the semiconductor manufacturing apparatus.

2. Related Art

Semiconductor technologies may include a technology for manufacturing a plurality of semiconductor chips on a wafer through an integrated circuit process, a technology for separating the plurality of semiconductor chips from the wafer and mounting them on a package substrate, a technology for securing electrical connections between the semiconductor chips and an external electronic device through the package substrate, a technology for forming a mold layer protecting the semiconductor chips from an external environment, and the like.

Among the technologies, a semiconductor packaging technology has attracted attention as a technology for miniaturized, high-speed, multifunctional, and high-performance package products, and a technology for manufacturing package products with high reliability at low cost. In addition, research on a semiconductor manufacturing apparatus that can implement such a technology is also continuously being conducted.

SUMMARY

A semiconductor manufacturing apparatus according to an embodiment of the disclosure may include a chuck configured to receive a carrier thereon, the chuck including a chuck reference key that is positioned at an edge portion thereof, a carrier contact device, including a contact position recognition key, configured to contact the carrier on the chuck, and a bonding head configured to transfer a semiconductor die to the carrier and configured to attach the semiconductor die on the carrier. The semiconductor manufacturing apparatus may include a camera configured to obtain images of the chuck reference key and the contact position recognition key.

The present disclosure provides a method of reading a carrier position according to an embodiment. In the method of reading the carrier position, a chuck including a chuck reference key, the chuck reference key being formed at an edge portion thereof, may be provided. A carrier may be positioned on the chuck. The carrier may be fixed on the chuck by using a carrier contact device including a contact position recognition key. The chuck reference key and the contact position recognition key may be read to determine a position of the carrier on the chuck.

The present disclosure provides a method of attaching a semiconductor die according to yet another embodiment. In the method of attaching the semiconductor die, a carrier may be positioned on a chuck including a chuck reference key, the chuck reference key formed at an edge portion thereof. The semiconductor die may be transferred to a predetermined position over the chuck reference key by using a bonding head including a bonding head reference key. Images of the chuck reference key and the bonding head reference key may be obtained by using a camera. A positional deviation of the bonding head reference key may be read from the chuck reference key at the predetermined position, based on an image data of the images that are obtained by the camera. The read positional deviation may be corrected and the semiconductor die may be attached on the carrier.

DETAILED DESCRIPTION

Figure 1:
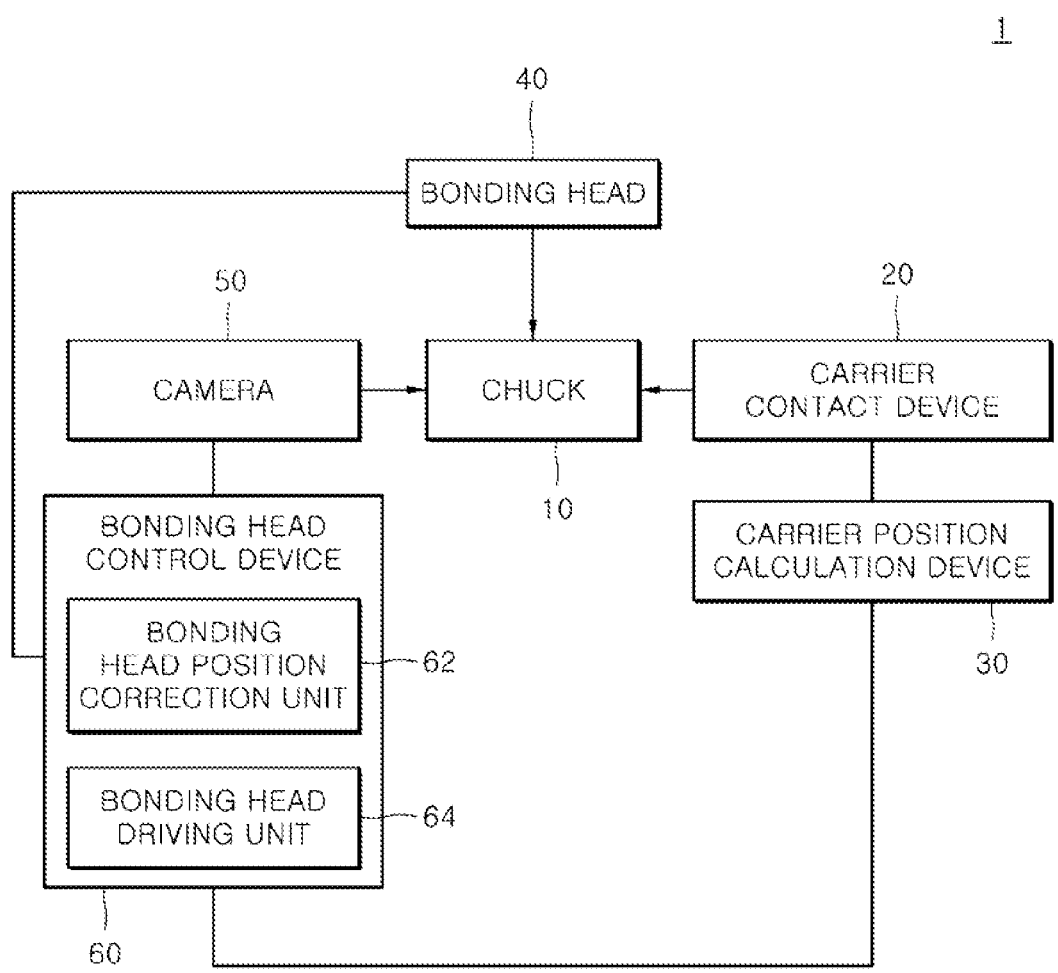
FIG. 1 is a block diagram schematically illustrating a semiconductor manufacturing apparatus according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction that is parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

As one of various semiconductor package manufacturing technologies, there is a fan-out wafer level package (hereinafter, referred to as "FOWLP") technology. The FOWLP technology may be performed in the following manner. First, semiconductor chips that are manufactured through integrated circuit processes are prepared, and the semiconductor chips are picked up and attached to positions on a wafer-shaped carrier. Subsequently, the semiconductor chips are molded over the carrier, and the carrier is removed. Redistribution layers are respectively formed on one surface of each of the semiconductor chips exposed while the carrier is removed. Then, a sawing process is performed for each unit package to secure a plurality of fan-out packages.

A semiconductor manufacturing apparatus according to an embodiment of the present disclosure may be applied to a process of picking up the semiconductor chips and attaching them to positions on the carrier, among the FOWLP technology. In addition, the semiconductor manufacturing apparatus may be applied to a process of aligning the carrier over a chuck, before attaching the semiconductor chips on the carrier. However, the application of the semiconductor manufacturing apparatus is not necessarily limited to the FOWLP technology field, and may be applied to a process of aligning a wafer over a chuck or a process of aligning semiconductor dies over a wafer in other various semiconductor manufacturing technology fields.

FIG. 1 is a block diagram schematically illustrating a semiconductor manufacturing apparatus 1 according to an embodiment of the present disclosure. Referring to FIG. 1, the semiconductor manufacturing apparatus 1 may include a chuck 10 configured to receive a carrier thereon, the chuck 10 with chuck reference keys along its edge. The semiconductor manufacturing apparatus 1 may include a carrier contact device 20, including a contact position recognition key, and a carrier position calculation device 30. The carrier contact device 20 may be configured to contact the carrier that is positioned on the chuck 10. The carrier position calculation device 30 may read the chuck reference key and the contact position recognition key in a state in which the carrier and the carrier contact device 20 are in contact with each other. In addition, the carrier position calculation device 30 may determine the position of the carrier based on the read chuck reference key and the contact position recognition key. The carrier position calculation device 30 may transmit the determined position of the carrier to a bonding head control device 60.

The semiconductor manufacturing apparatus 1 may include a bonding head 40 configured to transfer a semiconductor die to the carrier and configured to attach the semiconductor die on the carrier. In addition, the semiconductor manufacturing apparatus 1 may include a camera 50 that obtains images of the chuck reference key of the chuck 10, the contact position recognition key of the carrier contact device 20, and a bonding head reference key of the bonding head 4.

In addition, the semiconductor manufacturing apparatus 1 may include the bonding head control device 60 that is connected to the carrier position calculation device 30, the bonding head 40, and the camera 50. The bonding head control device 60 may include a bonding head position correction unit 62 and a bonding head driving unit 64. The bonding head position correction unit 62 may determine whether a positional deviation of the bonding head reference key of the bonding head 40 exists, from the chuck reference key, based on an image data of the images that are obtained by the camera 50. In addition, when a positional deviation exists, the bonding head position correction unit 62 may correct an operation error of the bonding head 40, based on the determined positional deviation. The bonding head driving unit 64 may refer to the corrected operation error value while driving the bonding head 40.

Further, the bonding head control device 60 may receive position information regarding the carrier on the chuck 10 from the carrier position calculation device 30. The bonding head control device 60 may additionally adjust the position on the carrier to which the semiconductor die is to be attached, based on the position information of the carrier. Subsequently, the bonding head driving unit 64 of the bonding head control device 60 may drive the bonding head 40 to move the semiconductor die to the correct position on the carrier to which the semiconductor die is to be attached and to attach the semiconductor die to the carrier.

Figure 2:
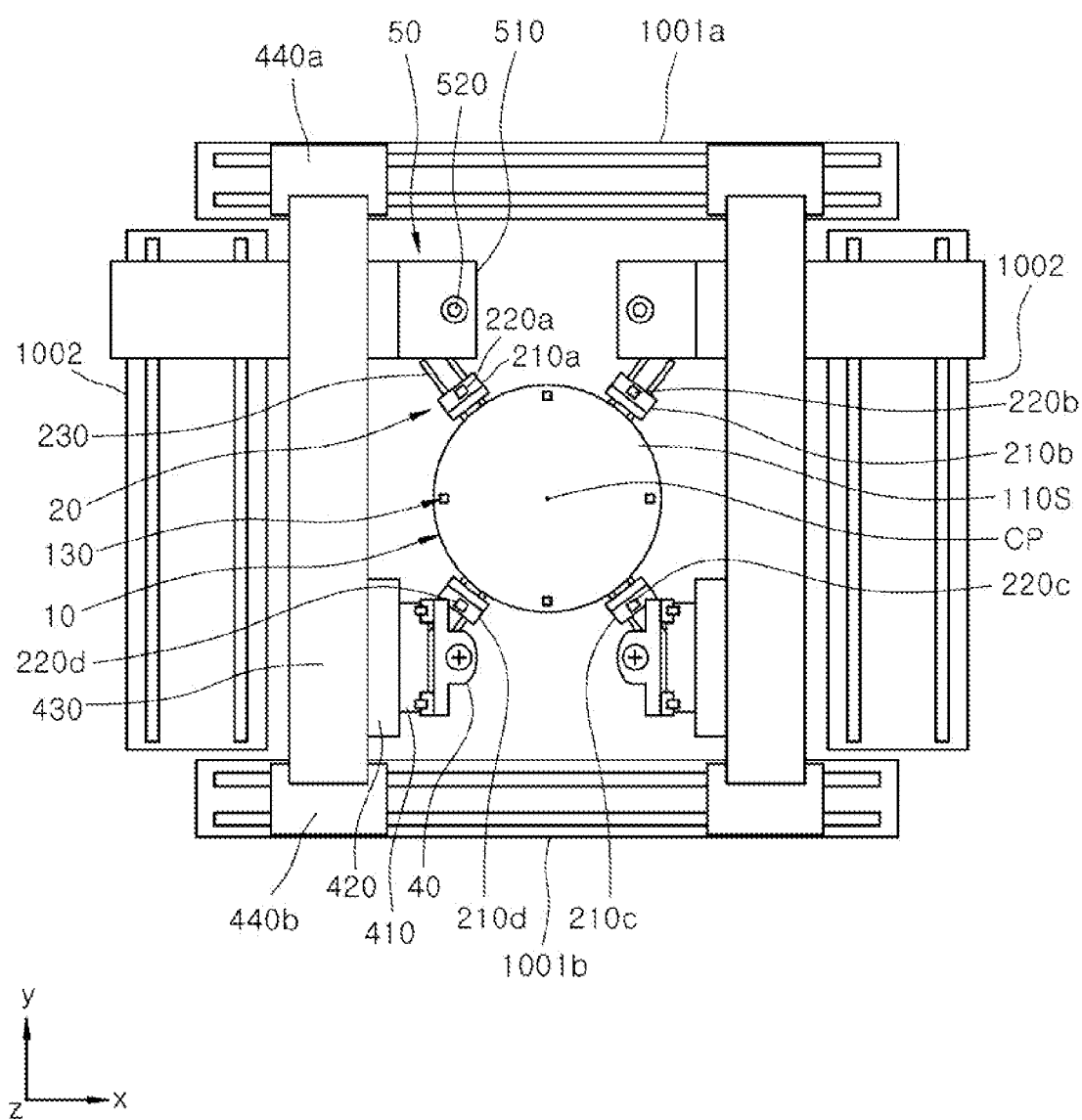
FIG. 2 is a plan view schematically illustrating a semiconductor manufacturing apparatus according to an embodiment of the present disclosure.
Figure 3A:
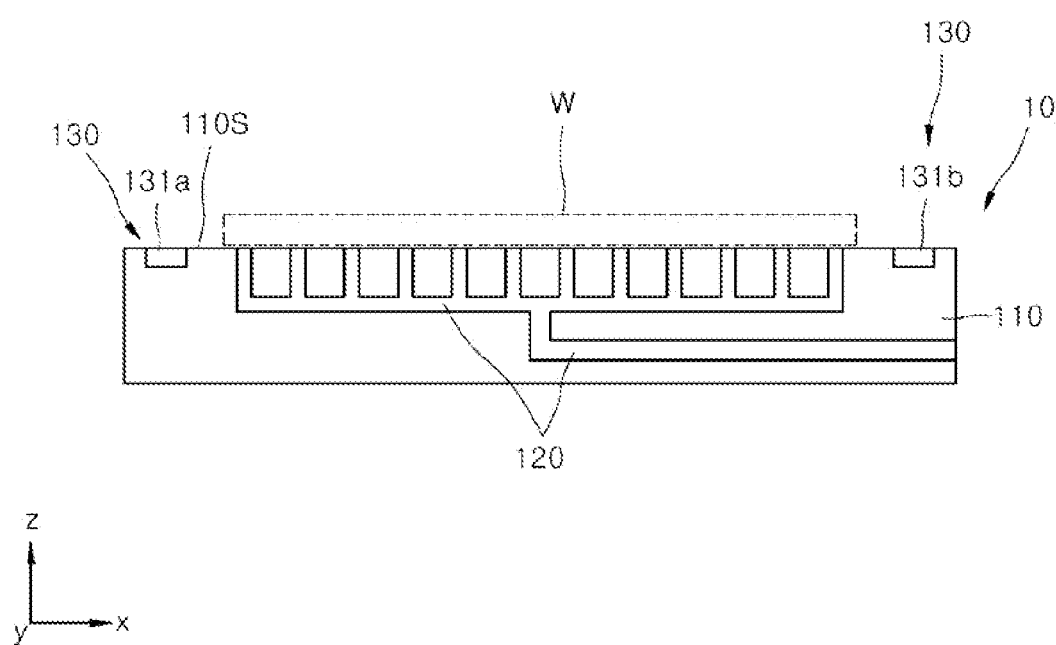
FIG. 3A is a cross-sectional view schematically illustrating a chuck of a semiconductor manufacturing apparatus according to an embodiment of the present disclosure.
Figure 3B:
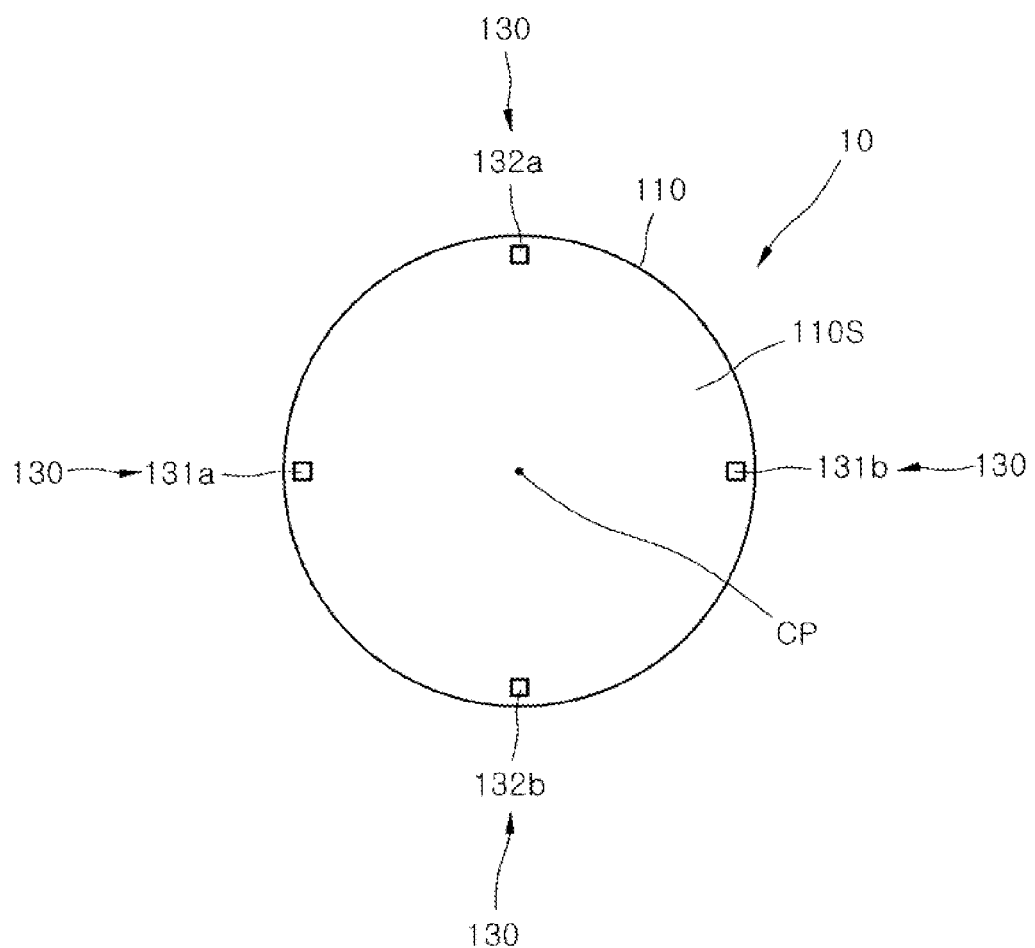
FIGS. 3B, 3C, and 3D are plan views schematically illustrating chucks of a semiconductor manufacturing apparatus according to embodiments of the present disclosure.
Figure 3C:
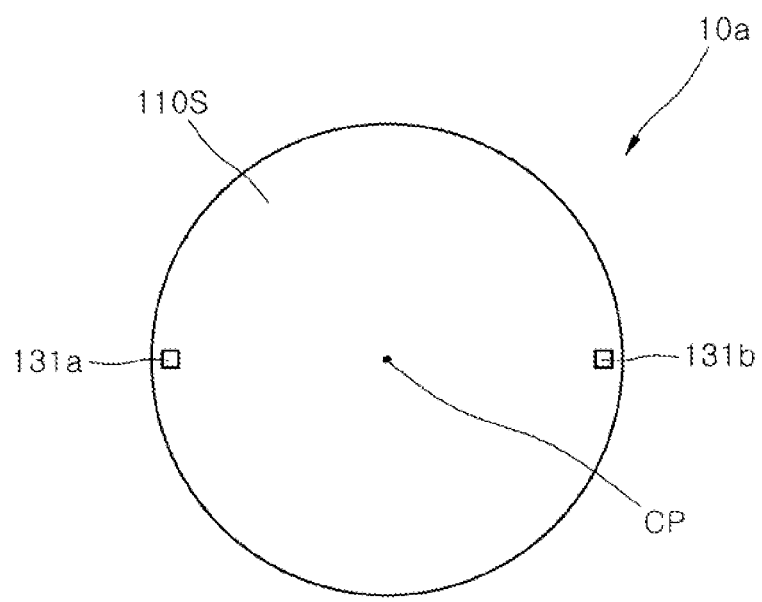
Figure 3D:
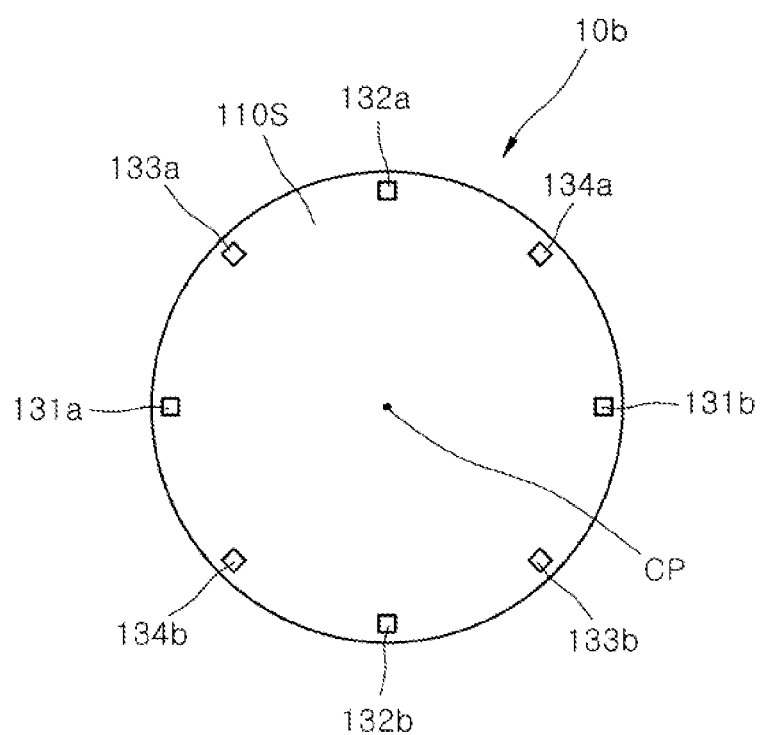
Figure 4A:
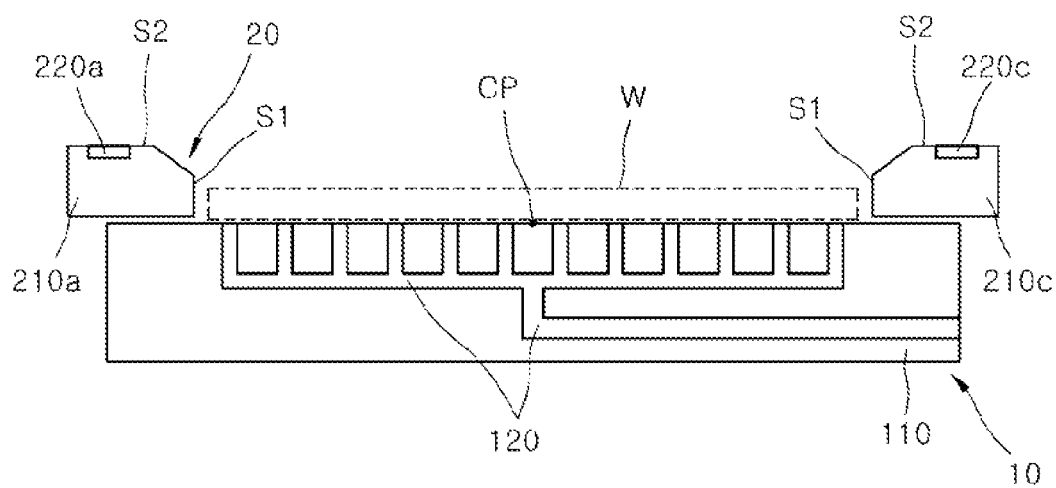
FIG. 4A is a view illustrating an arrangement of a carrier contact device of a semiconductor manufacturing apparatus according to an embodiment of the present disclosure.
Figure 4B:
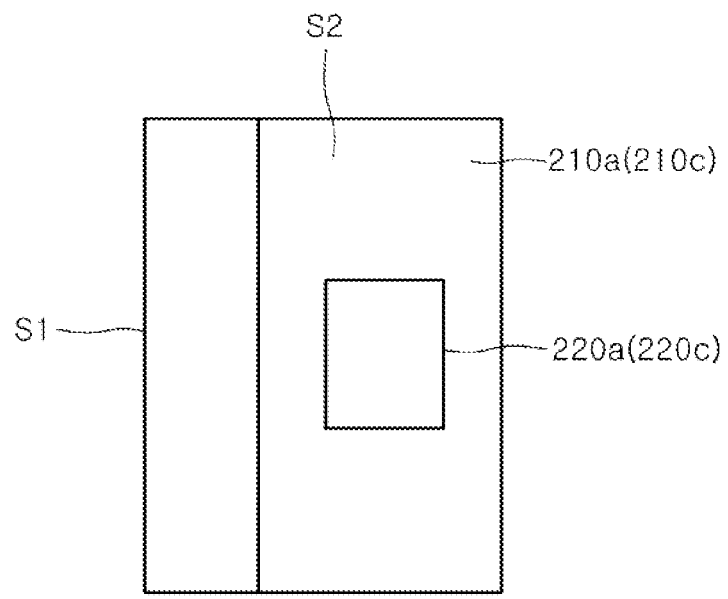
FIG. 4B is a plan view of the carrier contact device of the semiconductor manufacturing apparatus according to an embodiment of the present disclosure.
Figure 4B:
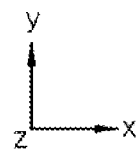

FIG. 2 is a plan view schematically illustrating a semiconductor manufacturing apparatus 2 according to an embodiment of the present disclosure. The semiconductor manufacturing apparatus 2 may be an implementation example of the semiconductor manufacturing apparatus 1 illustrated in the block diagram in FIG. 1. FIG. 3A is a cross-sectional view schematically illustrating a chuck of the semiconductor manufacturing apparatus according to an embodiment of the present disclosure. FIGS. 3B, 3C, and 3D are plan views illustrating chucks of the semiconductor manufacturing apparatus according to embodiments of the present disclosure. FIG. 4A is a view illustrating an arrangement of a carrier contact device of the semiconductor manufacturing apparatus according to an embodiment of the present disclosure. FIG. 4B is a plan view of a carrier contact device of the semiconductor manufacturing apparatus according to an embodiment of the present disclosure.

Referring to FIG. 2, the semiconductor manufacturing apparatus 2 may include a chuck 10, carrier contact devices 20, bonding heads 40, and cameras 50. The semiconductor manufacturing apparatus 2 may include first and second rails 1001a and 1001b that are installed to extend in a first direction (i.e., x-direction), and a pair of third rails 1002 that are installed to extend in a second direction (i.e., y-direction).

Referring to FIG. 3A, the chuck 10 may be configured to receive a carrier W thereon. In addition, the chuck 10 may include a chuck body 110 with a vacuum flow path 120. The vacuum flow path 120 may extend from within the chuck body 110 to an upper surface 110S of the chuck body 110. The vacuum flow path 120 may be divided into multiple flow paths as it extends to the upper surface 110S of the chuck body 110. In addition, the vacuum flow path 120 may extend outside of the chuck body 110 to be connected to a vacuum device (not illustrated) through another side of the chuck body 110. The chuck 10 may be configured to suck air through the vacuum flow path 120 while the carrier W is seated to fix the carrier W on the chuck 10. In addition, the chuck 10 may be configured to blow air through the vacuum flow path 120 to float the carrier W over the chuck 10.

Referring to FIGS. 2, 3A, and 3B together, chuck reference keys 130 may be disposed near the edge of the chuck body 110 on the upper surface 110S. The chuck reference keys 130 may include one or more chuck position recognition keys 131a, 131b, 132a, and 132b indicating fixed positions on the upper surface 110S of the chuck body 110. In an embodiment, the one or more chuck position recognition keys 131a, 131b, 132a, and 132b may be disposed in such a way that at least one pair of chuck position recognition keys face each other from opposite sides with respect to a center CP of the chuck 10.

When the upper surface 110S of the chuck body 110 has a shape of a circle, the center CP of the chuck 10 may be the center of the circle. Alternatively, when the upper surface 110S of the chuck body 110 has a shape of an ellipse or polygon, the center CP of the chuck 10 may be the center of gravity of the ellipse or polygon.

Meanwhile, in connection with the arrangement of the one or more chuck position recognition keys 131a, 131b, 132a, and 132b, FIG. 3B discloses two pairs of chuck position recognition keys 131a, 131b, 132a, and 132b facing each other with respect to the center CP of the chuck 10, but the present disclosure is not limited thereto, and the number and arrangement of the pairs of chuck position recognition keys may be modified in many ways. As an example, another chuck 10a illustrated in FIG. 3C may include a pair of chuck position recognition keys 131a and 131b disposed to face each other with respect to the center CP of the chuck 10a. As another example, another chuck 10b illustrated in FIG. 3D may include four pairs of chuck position recognition keys 131a, 131b, 132a, 132b, 133a, 133b, 134a, 134b arranged to face each other with respect to the center CP of the chuck 10b.

The at least one chuck position recognition key illustrated in FIGS. 3B, 3C, and 3D may be formed on the chuck body 110 in an embossed carving pattern or in a depressed carving pattern.

Referring to FIGS. 2, 4a, and 4b together, the carrier contact devices 20 are disposed adjacent to the chuck 10. The carrier contact devices 20 may include a plurality of push bars 210a, 210b, 210c, and 210d, and a plurality of contact position recognition keys 220a, 220b, 220c, and 220d disposed on the plurality of push bars 210a, 210b, 210c, and 210d, respectively.

The plurality of push bars 210a, 210b, 210c, and 210d may be disposed in such a manner that at least one pair of push bars face each other from opposite sides with respect to the center CP of the chuck 10. Referring to FIG. 2, two pairs of push bars 210a, 210b, 210c, and 210d may be disposed at opposite sides with respect to the center CP of the chuck 10. In this case, the first to fourth push bars 210a, 210b, 210c, and 210d may be disposed along the circumference of the chuck 10 at intervals of 90° to each other with respect to the center CP of the chuck 10. As described above, although two pairs of push bars 210a, 210b, 210c, and 210d are illustrated in FIG. 2, the number and arrangement of the pair of push bars are not limited thereto, and the number and arrangement of the pairs of push bars may be modified in many ways.

Referring to FIG. 2, the plurality of push bars 210a, 210b, 210c, and 210d may move from the outside of the chuck 10 toward the center CP of the chuck 10 on a plane parallel to the upper surface 110S of the chuck 10 by using the rails 230. Referring to FIGS. 2, 4A and 4B together, each of the plurality of push bars 210a, 210b, 210c, and 210d may have a side surface S1 and an upper surface S2. The side surfaces S1 of the plurality of push bars may contact the side surfaces of the carrier W, as will be described with reference to FIGS. 6A to 6C. The contact position recognition keys 220a, 220b, 220c, and 220d may be disposed on upper surfaces S2 of the plurality of push bars 210a, 210b, 210c, and 210d, respectively.

Although not illustrated in FIGS. 2, 4A, and 4B, a position detection unit for determining the positions of the plurality of contact position recognition keys 220a, 220b, 220c, and 220d may be provided. The position detection unit may be disposed inside the carrier position calculation device 30 of FIG. 1. In an embodiment, the position detection unit may derive the positions of the plurality of contact position recognition keys 220a, 220b, 220c, and 220d that have moved together with the plurality of push bars 210a, 210b, 210c, and 210d. In an embodiment, in order to derive the positions of the plurality of contact position recognition keys 220a, 220b, 220c, and 220d, the position detection unit may read images of the chuck reference key 130 and the plurality of contact position recognition keys 220a, 220b, 220c, and 220d obtained by the camera 50.

Referring to FIG. 2 again, the bonding heads 40 may be disposed over the chuck 10. The bonding heads 40 may be configured to transfer a separately provided semiconductor die to attach the semiconductor die to a carrier mounted on the chuck 10. As will be described in detail in connection with FIG. 8, each of the bonding heads 40 may include a bonding head reference key (405 in FIG. 8) disposed at a position facing the chuck 10. The bonding head reference keys 405 may provide a reference for correcting the positions of the bonding heads 40. As an example, a reference value input to the bonding head reference key may set information on a reference position at which the operations of the bonding heads 40 start or end. Meanwhile, when the bonding heads 40 repeat the semiconductor die attaching operation, a positional deviation with respect to the reference position may occur due to an error occurring in a moving process. As will be described later, in an embodiment of the present disclosure, the bonding head reference keys 405 of the bonding heads 40 may be compared with the chuck reference keys 130 disposed at fixed positions on the chuck 10, so that it is possible to determine whether a positional deviation with respect to the reference position has occurred and a size of the positional deviation. In addition, the reference positions of the bonding heads 40 may be corrected to correct the positional deviation.

Through this, reliability of the die attaching operation of the bonding heads 40 may be improved.

Referring to FIG. 2, the bonding heads 40 may move in a third direction (i.e., z-direction) while being connected to first coupling members 410. Although not illustrated, the bonding heads 40 may move in the third direction (i.e., z-direction) through rails formed in the first coupling members 410. The first coupling members 410 may be coupled to third coupling members 430 while being connected to second coupling members 420. Although not illustrated, by moving the second coupling members 420 in the second direction (i.e., y-direction) through rails formed on the third coupling members 430, so that the bonding heads 40 connected to the second coupling members 420 may move in the second direction (i.e., y-direction). In addition, both ends of each of the third coupling members 430 are coupled to fourth and fifth coupling members 440a and 440b, respectively, and the fourth and fifth coupling members 440a and 440b may move on the first rails 1001a and the second rails 1000b, respectively, so that the bonding heads 40 may move in the first direction (i.e., x-direction). FIG. 2 illustrates a pair of bonding heads 40 as an embodiment, but the present disclosure is not limited thereto, and various numbers of the bonding heads 40 may be disposed.

Referring to FIG. 2 again, the cameras 50 may be provided. Each of the cameras 50 may include a camera body 510 and an imaging device 520, as illustrated in detail in FIG. 8. The imaging device 520 may include a lens and an image sensor for capturing an image. The imaging device 520 may obtain images of the chuck reference keys 130 of the chuck 10 and the contact position recognition keys 220a, 220b, 220c, and 220d of the carrier contact device 20, as will be described later in connection with FIGS. 6A to 6C. In addition, the imaging device 520 may obtain images of the bonding head reference keys 405 of the bonding heads 40 and the chuck reference keys 130 of the chuck 10, as will be described later with reference to FIG. 8.

Although not illustrated in FIG. 2, the carrier position calculation device 30 described with reference to FIG. 1 may determine the position of the carrier over the chuck 10, based on image data of images obtained by the cameras 50. In addition, the bonding head position correction unit 62 of the bonding head control device 60 described with reference to FIG. 1 may determine the positional deviation of the bonding head reference keys 405 of the bonding heads 40, based on the chuck reference keys 130, based on the image data of images obtained by the cameras 50. The bonding head position correction unit 62 may correct the error related to the operation of the bonding heads 40 by correcting the read positional deviation. The bonding head driving unit 64 of the bonding head control device 60 described with reference to FIG. 1 may refer to the corrected error value while driving the bonding heads 40.

Figure 5:
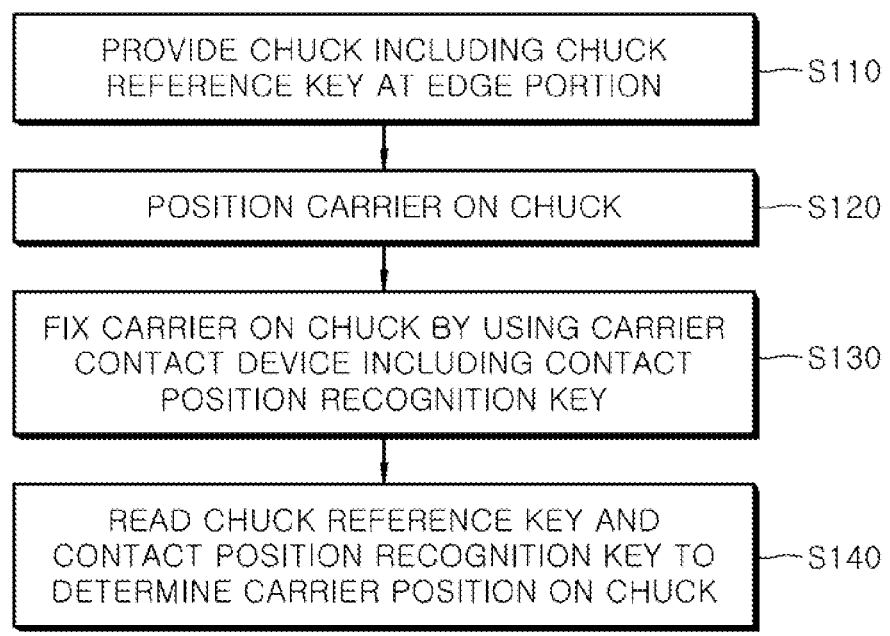
FIG. 5 is a flowchart schematically illustrating a method of reading a position of a carrier according to an embodiment of the present disclosure.
Figure 6A:
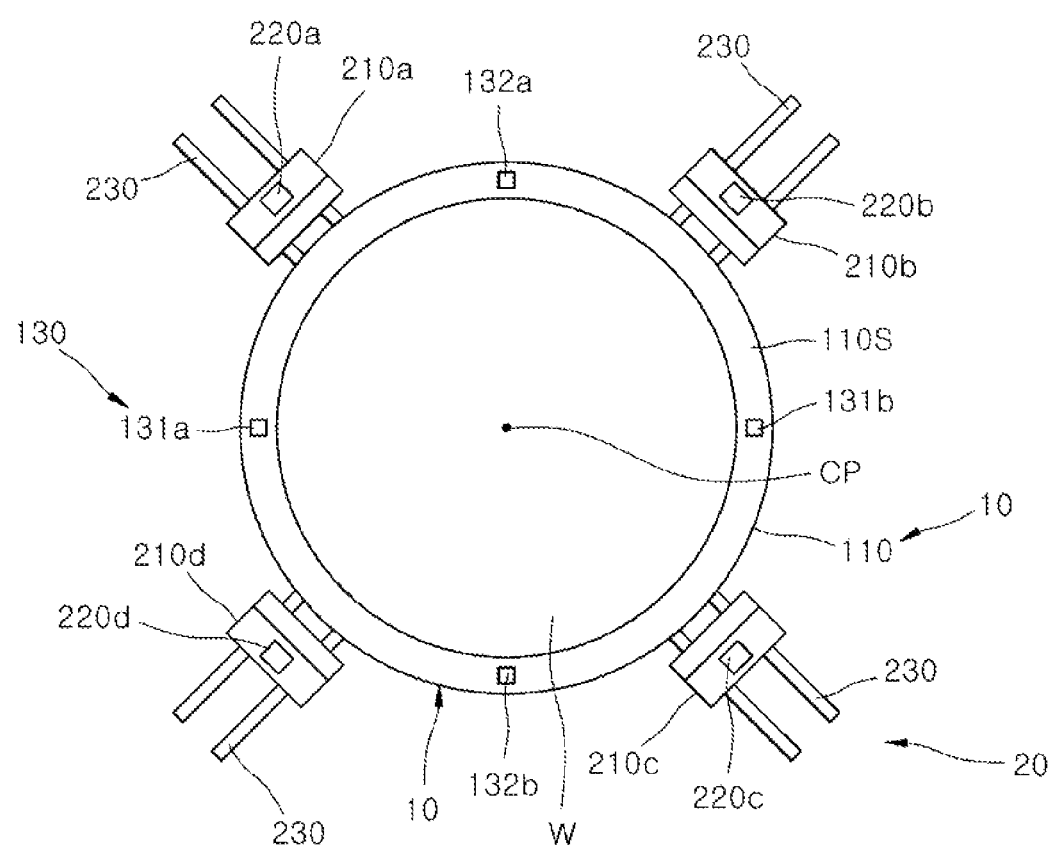
FIGS. 6A to 6C are views illustrating a method of reading a position of a carrier according to an embodiment of the present disclosure.
Figure 6B:
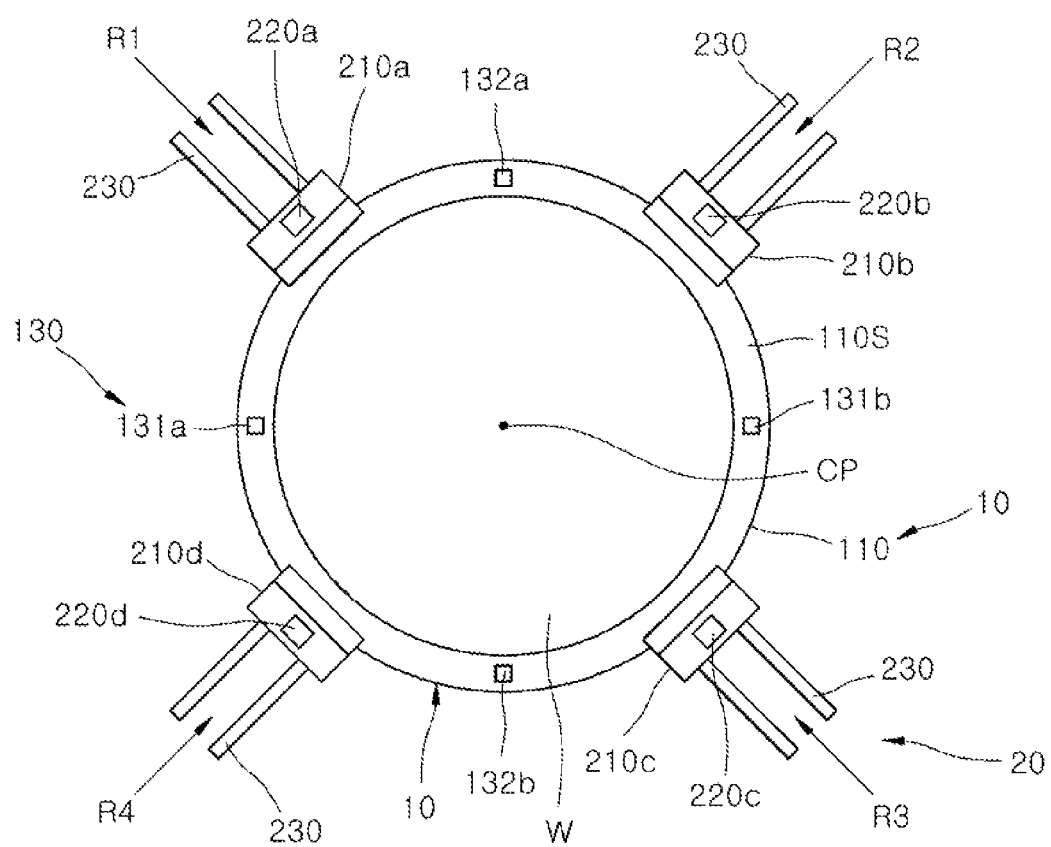
Figure 6C:
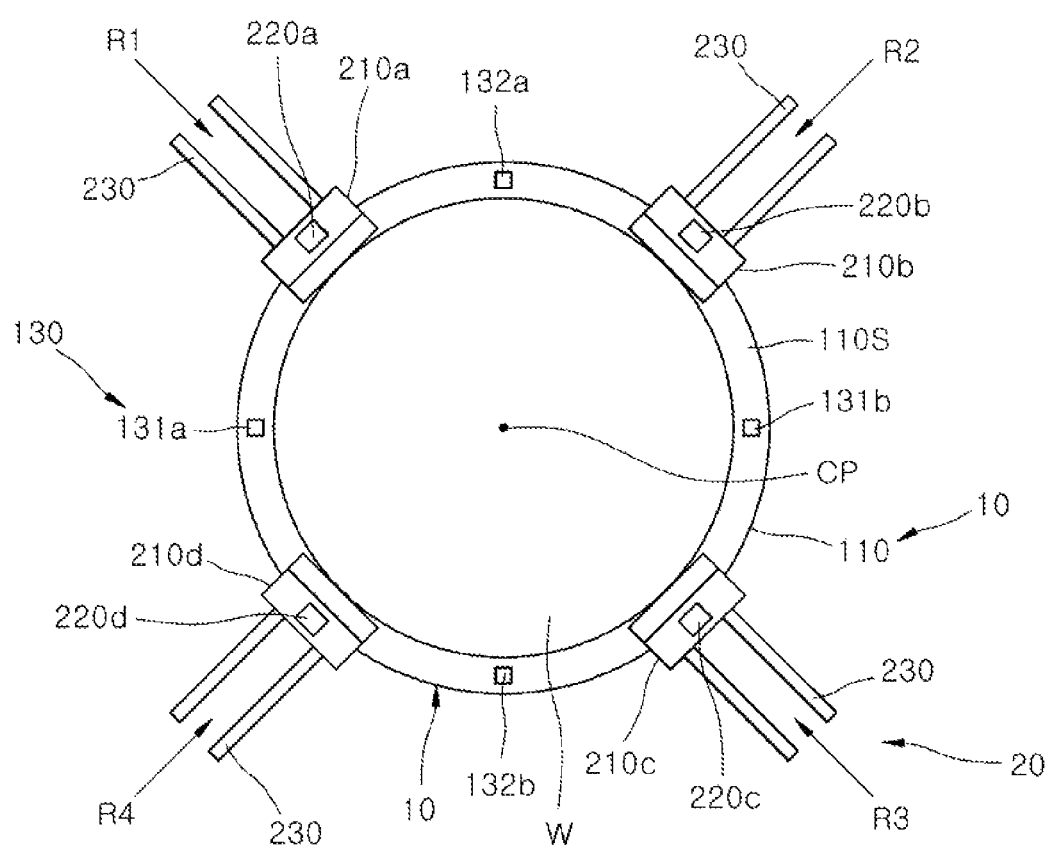

FIG. 5 is a flowchart schematically illustrating a method of reading a carrier position according to an embodiment of the present disclosure. FIGS. 6A to 6C are views illustrating a method of reading a carrier position according to an embodiment of the present disclosure. In an embodiment, the method of reading the carrier position according to the flowchart of FIG. 5 may be performed by using the semiconductor manufacturing apparatus 1 of FIG. 1, or the semiconductor manufacturing apparatus 2 described above in connection with FIGS. 2, 3A, 3B, 4A, and 4B.

Referring to operation S110 of FIG. 5, a chuck with a chuck reference key at an edge portion is provided. As described in connection with FIGS. 2, 3A, and 3B, the chuck reference key may be disposed at the edge portion on an upper surface of a chuck body constituting the chuck. The chuck reference key may include at least one chuck position recognition key indicating a fixed position on the upper surface of the chuck body.

Referring to operation S120 of FIG. 5, a carrier W is positioned on the chuck. According to an embodiment, as illustrated in FIG. 6A, the carrier W may be positioned on the upper surface 110S of the chuck body 110. The carrier W may be positioned so as not to cover the chuck position recognition keys 131a, 131b, 132a, and 132b of the chuck reference key 130 on the upper surface 110S of the chuck body 110. That is, the chuck position recognition keys 131a, 131b, 132a, and 132b are exposed on the upper surface 110S of the chuck body 110 where the carrier W is positioned.

Meanwhile, in operation S120, the carrier W might not be fixed to the chuck 10. In an embodiment, the chuck 10 might not perform an operation of sucking air through the vacuum flow path 120 of FIG. 3A, so that the carrier W might not be fixed to the chuck 10. In another embodiment, the chuck may eject air through the vacuum flow path 120 of FIG. 3A so that the carrier W may maintain a floating state over the chuck 10.

Referring to operation S130 of FIG. 5, the carrier is fixed on the chuck by using carrier contact devices including position recognition keys. In an embodiment, operation S130 will be described in detail with reference to FIGS. 6A to 6C. Referring to FIG. 6A, carrier contact devices 20 are provided to be positioned adjacent to the chuck 10 on which the carrier W is seated on the upper surface 110S. The carrier contact devices 20 include first to fourth push bars 210a, 210b, 210c, and 210d. In addition, the carrier contact devices 20 may include first to fourth contact position recognition keys 220a, 220b, 220c, and 220d which are disposed on the first to fourth push bars 210a, 210b, 210c, and 210d, respectively.

The first push bar 210a and the third push bar 210c may be disposed at opposite sides with respect to a center CP of the chuck 10. The second push bar 210b and the fourth push bar 210d may be disposed at opposite sides with respect to the center CP of the chuck 10. The first to fourth push bars 210a, 210b, 210c, and 210d may be disposed along the circumference of the chuck 10 at intervals of 90° with respect to the center CP of the chuck 10.

Each of the first to fourth push bars 210a, 210b, 210c, and 210d may be disposed on a rail 230 facing the center CP of the chuck 10. The rails 230 may be disposed on a plane parallel to the upper surface 110S of the chuck 10. As illustrated in FIG. 6A, the first to fourth push bars 210a, 210b, 210c, and 210d may be disposed to be spaced apart from the chuck 10.

Referring to FIG. 6B, the first to fourth push bars 210a, 210b, 210c, and 210d may move toward the center CP of the chuck 10 on the rails 230. Specifically, the first push bar 210a, the second push bar 210b, the third push bar 210c, and the fourth push bar 210d may move along a first direction R1, a second direction R2, a third direction R3, and a fourth direction R4, respectively, which are configured toward the center CP of the chuck 10 on a plane parallel to the upper surface 110S of the chuck 10.

Referring to FIG. 6C, the first to fourth push bars 210a, 210b, 210c, and 210d moved toward the center CP of the chuck 10 may contact the carrier W. In addition, during the first to fourth push bars 210a, 210b, 210c, and 210d contact the carrier W, the first to fourth push bars 210a, 210b, 210c, and 210d may apply the same amount of force to the carrier W in the first to fourth directions R1, R2, R3, and R4, respectively. Subsequently, while the forces applied in the first to fourth directions R1, R2, R3, and R4 are balanced, the carrier W may be fixed on the upper surface 110S of the chuck 10.

Referring to operation S140 of FIG. 5, the position of the carrier on the chuck may be determined by reading the chuck reference keys and the contact position recognition keys. According to an embodiment, as illustrated in FIG. 6C, in a state in which the carrier W is fixed by the first to fourth push bars 210a, 210b, 210c, and 210d, the plurality of chuck position recognition keys 131a, 131b, 131c, and 131 of the chuck reference keys 130 and the first to fourth contact position recognition keys 220a, 220b, 220c, and 220d of the carrier contact devices 20 may be read. In this case, the process of reading the plurality of chuck position recognition keys 131a, 131b, 131c, and 131 and the first to fourth contact position recognition keys 220a, 220b, 220c, and 220d may include a process of obtaining images including the plurality of chuck position recognition keys 131a, 131b, 131c, and 131d and the first to fourth contact position recognition keys 220a, 220b, 220c, and 220d by using the cameras 50 described with reference to FIGS. 1 and 2, and a process of recognizing images of the plurality of chuck position recognition keys 131a, 131b, 131c, and 131d and the first to fourth contact position recognition keys 220a, 220b, 220c, and 220d by using the position detection unit of the carrier position calculation device 30 described above with reference FIG. 1.

In an embodiment, the process of recognizing images of the plurality of chuck position recognition keys 131a, 131b, 131c, and 131d and the first to fourth contact position recognition keys 220a, 220b, 220c, and 220d may include comparing shapes of recognition keys and contact position recognition keys in the obtained images with standard shapes of recognition keys and contact position recognition keys stored in the position detection unit. When the shapes in the obtained images corresponds to the standard shapes, the center points of the shapes of the plurality of chuck position recognition keys 131a, 131b, 131c, and 131d in the obtained images may be determined as first points, and the center points of the shapes of the first to fourth contact position recognition keys 220a, 220b, 220c, and 220d in the obtained images may be determined as second points.

Subsequently, the positions of the first to fourth contact position recognition keys 220a, 220b, 220c, and 220d may be determined by using the read plurality of chuck position recognition keys 131a, 131b, 131c, and 131d and the first to fourth contact position recognition keys 220a, 220b, 220c, and 220d. In an embodiment, because the positions of the plurality of chuck position recognition keys 131a, 131b, 131c, and 131d are fixed or predetermined positions on the chuck body 110, the positions of the first to fourth contact position recognition keys 220a, 220b, 220c, and 220d may be relatively determined based on the positions of the plurality of chuck position recognition keys 131a, 131b, 131c, and 131d. In an embodiment, after the first points are amended to the fixed or predetermined positions, and the second points are amended based on the amended first points, the amended second points may be determined as the positions of the first to fourth contact position recognition keys 220a, 220b, 220c, and 220d. In addition, the position of the carrier W on the upper surface 110S of the chuck body 110 may be derived based on the determined positions of the first to fourth contact position recognition keys 220a, 220b, 220c, and 220d.

In an embodiment, the method of deriving the position of the carrier W may include a process of expressing the determined positions of the first to fourth contact location recognition keys 220a, 220b, 220c, and 220d as corresponding coordinates on the upper surface 110S, and a process of deriving a center coordinate of the carrier W by calculating the coordinates. In an embodiment, the process of determining the positions of the first to fourth contact position recognition keys 220a, 220b, 220c, and 220d and deriving the position of the carrier W may be performed by using the carrier position calculation device 30 described in connection with FIG. 1.

As described above, according to an embodiment of the disclosure, the position of a carrier disposed on a chuck may be determined by using the chuck including a chuck reference key and a carrier contact device including contact position recognition keys. In this case, regardless of whether the carrier has a separate recognition key or recognition pattern used for position reading, the position of the carrier may be relatively determined based on a position of the chuck reference key disposed at a fixed position on the chuck. Accordingly, when a semiconductor process is performed for the carrier on the chuck, the position of the carrier on the chuck may be read more reliably, and the position information of the carrier may be utilized for the progress of the semiconductor process.

Figure 7:
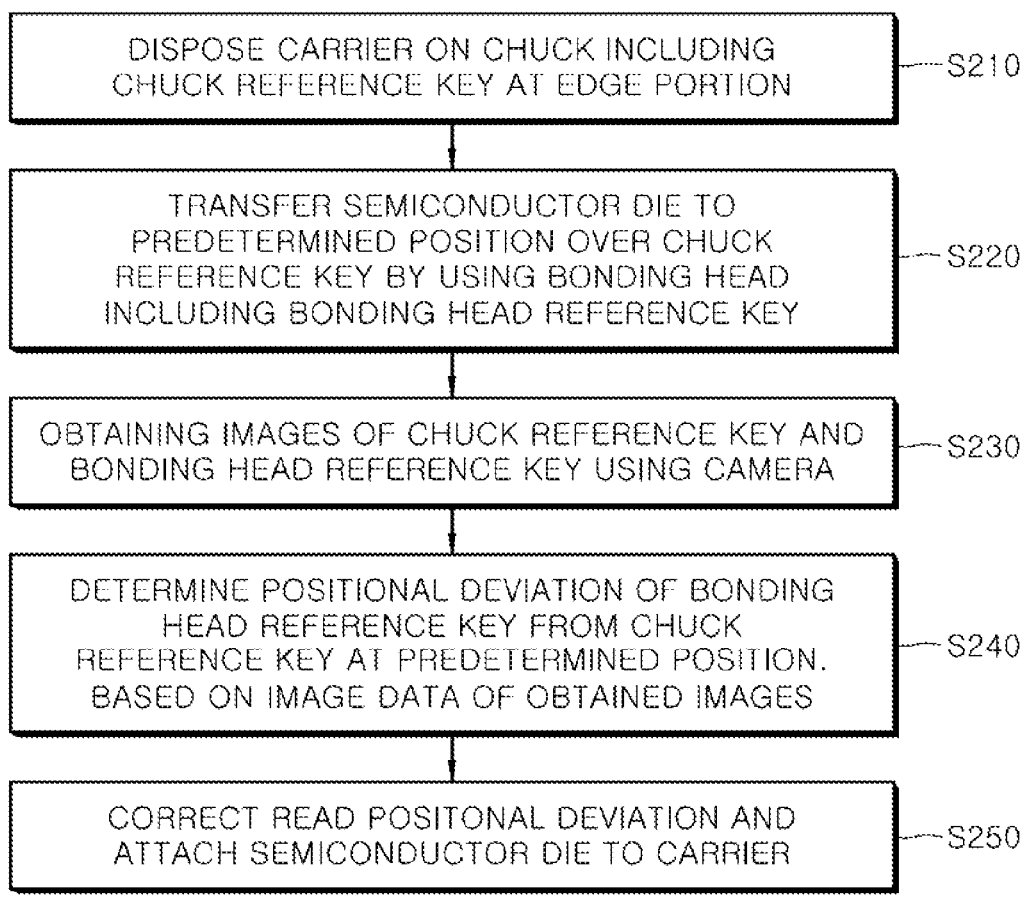
FIG. 7 is a flowchart schematically illustrating a method of attaching a semiconductor die according to an embodiment of the present disclosure.
Figure 8:
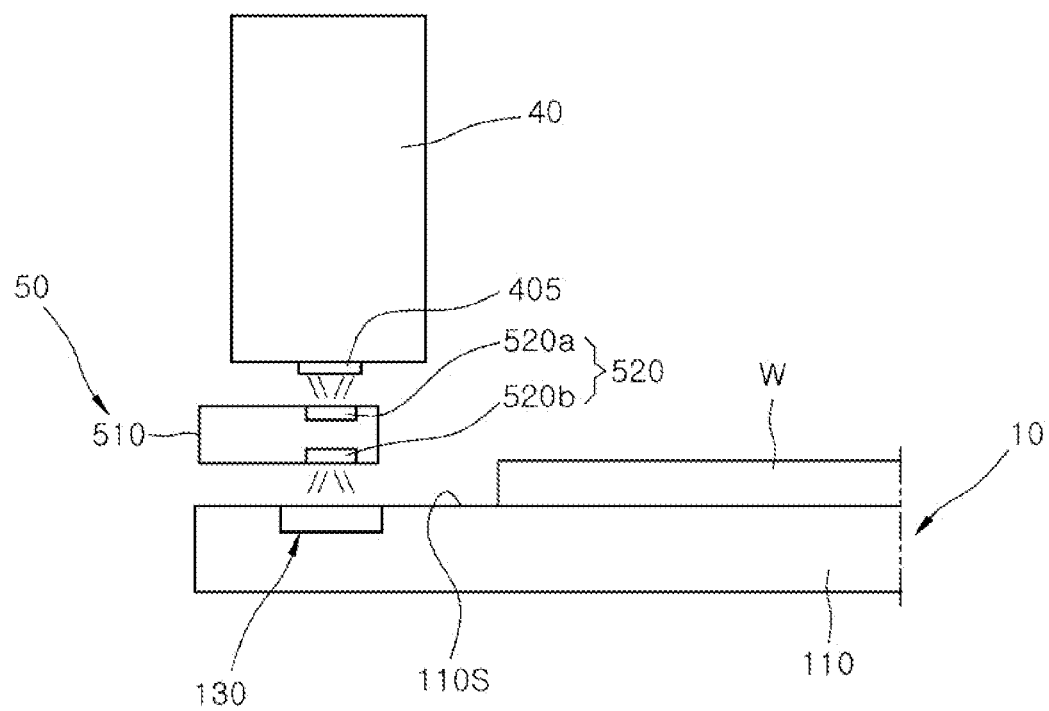
FIG. 8 is a view schematically illustrating a process in a method of attaching a semiconductor die according to an embodiment of the present disclosure.

FIG. 7 is a flowchart schematically illustrating a method of attaching a semiconductor die according to an embodiment of the present disclosure. FIG. 8 is a view schematically illustrating a process in the method of attaching a semiconductor die according to an embodiment of the present disclosure. In an embodiment, the method of attaching a semiconductor die according to the flowchart of FIG. 7 may be performed by using the semiconductor manufacturing apparatus 1 of FIG. 1, or the semiconductor manufacturing apparatus 2 described above with reference to FIGS. 2, 3A, 3B, 3C, 4A, and 4B.

Referring to operation S210 of FIG. 7, a carrier is disposed on a chuck including a chuck reference key at an edge portion. In an embodiment, as illustrated in FIG. 3B, the chuck reference key 130 may include one or more chuck position recognition keys 131a, 131b, 132a, and 132b indicating fixed portions on an upper surface 110S of the chuck 10.

In an embodiment, the operation S210 may include a process of determining the position of the carrier on the chuck. As an example, the process of determining the position of the carrier may include operations S110 to S140 described above with reference to FIG. 5. That is, the operation S210 may include a process of positioning the carrier on the chuck, a process of fixing the carrier on the chuck by using a carrier contact device including contact position recognition keys, and a process of reading the chuck reference key and the contact position recognition keys to determine the position of the carrier on the chuck. As a result, the carrier may be disposed on the chuck with the position on the chuck read based on the chuck reference key. In addition, in operation S210, operation S220 of FIG. 7 may be performed by disposing the carrier so as not to cover the chuck reference key. In the semiconductor manufacturing apparatus of FIG. 1 according to an embodiment, the carrier position calculation device 30 may transfer information on the read position of the carrier to the bonding head control device 60 of FIG. 1.

Referring to operation S220 of FIG. 7, a semiconductor die is transferred to a predetermined position over the chuck reference key by using a bonding head including a bonding head reference key. In an embodiment, referring to FIGS. 2 and 8 together, the semiconductor die may be transferred to the predetermined position that is disposed directly over one chuck position recognition key selected from the plurality of chuck position recognition keys 131a, 131b, 132a, and 132b of the chuck reference key 130 by using the bonding head 40. In an embodiment, the selected one chuck position recognition key may be a chuck position recognition key positioned closest to a set attachment position on the carrier W to which the semiconductor die will be attached.

Referring to operation S230 of FIG. 7, images of the chuck reference key and the bonding head reference key are obtained by using cameras. In an embodiment, referring to FIGS. 2 and 8 together, the cameras 50 are moved so that imaging devices 520 are disposed between the chuck reference key 130 of the chuck 10 and the bonding head reference key 405 of the bonding head 40. The imaging device 520 of the camera 50 may include a first imaging unit 520a and a second imaging unit 520b disposed in different directions from a camera body 510. The first and second imaging units 520a and 520b may sequentially or simultaneously photograph the bonding head reference key 405 and the chuck reference key 130 to generate imaging data. As an example, as illustrated in FIG. 8, the first imaging unit 520a may photograph the bonding head reference key 405 of the bonding head 40 positioned over the camera 50, and the second imaging unit 520b may photograph the chuck reference key 130 of the chuck 10 positioned below the camera 50.

Referring to operation S240 of FIG. 7, based on the image data of the images obtained by the camera, the positional deviation of the bonding head reference key is determined from the chuck reference key at the predetermined position. According to an embodiment, as described above with reference to FIGS. 2, 3A, and 3B, the positions of the one or more chuck position recognition keys 131a, 131b, 132a, and 132b of the chuck reference key 130 may be fixed positions on the chuck 10. If the positional deviation occurs between the bonding head reference key 405 of the bonding head 40 and the selected one chuck position recognition key of the chuck reference key 130, based on the image data of the images obtained by the camera 50, the positional deviation may be determined to be caused by accumulated positional changes during the operations of the bonding head 40. In the semiconductor manufacturing apparatus of FIG. 1 according to an embodiment, the operation S240 may be performed by the bonding head position correction unit 62 of the bonding head control device 60.

Referring to operation S250 of FIG. 7, the read positional deviation is corrected and the semiconductor die is attached to the carrier. In an embodiment, referring to FIG. 8, when a positional deviation of the bonding head reference key 405 occurs at the position of the selected chuck position recognition key of the chuck reference key 130, an operation error of the bonding head 40 may be corrected by correcting the positional deviation. Then, the semiconductor die may be transferred to a set attachment position on the carrier W by using the bonding head 40 for which the operation error has been corrected. Subsequently, the bonding head 40 may attach the semiconductor die to the set attachment position on the carrier W. In the semiconductor manufacturing apparatus of FIG. 1 according to an embodiment, the operation S250 may be performed by the bonding head position correction unit 62 and the bonding head driving unit 64 of the bonding head control device 60.

By performing the above-described process, the semiconductor die according to the embodiment of the present disclosure may be attached on the carrier.

In some embodiments, when attaching a plurality of semiconductor dies to the carrier, the operation error correction process of the bonding head 40 related to the operations S220 to S250 may be performed whenever each of the plurality of semiconductor dies is attached to the carrier W. In other embodiments, when attaching a plurality of semiconductor dies to the carrier, the operation error correction process of the bonding head 40 related to the operations S220 to S250 may be performed only during the attaching process for some of the plurality of semiconductor dies. That is, when attaching a plurality of semiconductor dies to the carrier, all operations S210 to S250 may be performed for some semiconductor dies, and the operation error correction process of the bonding head 40 may be omitted among the operations S210 to S250 for some semiconductor dies. As an example, when performing the operation of attaching the plurality of semiconductor dies to the carrier, the operation error correction process of the bonding head 40 may be periodically performed.

As described above, according to an embodiment of the present disclosure, in a method of attaching a semiconductor die, the operation error of a bonding head may be corrected by using a chuck including a chuck reference key and a bonding head including a bonding head reference key. The semiconductor die may be reliably attached to a more accurate position on a carrier by correcting the positional deviation of the bonding head reference key, based on the chuck reference key.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor manufacturing apparatus comprising:
a chuck configured to receive a carrier thereon, the chuck including a chuck reference key that is positioned at an edge portion thereof;
a carrier contact device, including a contact position recognition key, configured to contact the carrier on the chuck;
a bonding head configured to transfer a semiconductor die to the carrier and configured to attach the semiconductor die on the carrier; and
a camera configured to obtain images of the chuck reference key and the contact position recognition key,
wherein the carrier contact device includes:
a plurality of push bars spaced apart from the chuck, capable of moving toward a center of the chuck on a plane that is parallel to the upper surface of the chuck; and
the contact location recognition keys disposed on each of the plurality of push bars.

2. The semiconductor manufacturing apparatus of claim 1, further comprising a bonding head control device connected to the camera and the bonding head,
wherein the bonding head control device includes:
a bonding head position correction unit configured to determine a positional deviation of the bonding head reference key from the chuck reference key based on image data of the images that are obtained by the camera and configured to correct an operation error of the bonding head based on the determined positional deviation; and
a bonding head driving unit configured to drive the bonding head based on the corrected operation error.

3. The semiconductor manufacturing apparatus of claim 1, wherein the chuck reference key comprises at least one chuck position recognition key that indicates a fixed position on an upper surface of the chuck.

4. The semiconductor manufacturing apparatus of claim 1, wherein the plurality of push bars are positioned such that at least a pair of push bars are located to face each other at opposite sides with respect to the center of the chuck.

5. The semiconductor manufacturing apparatus of claim 1, wherein each of the plurality of push bars is disposed along a circumference of the chuck at intervals of 90° with respect to the center of the chuck.

6. The semiconductor manufacturing apparatus of claim 1, further comprising a carrier position calculation device connected to the carrier contact device,
wherein the carrier position calculation device is configured to perform an operation of reading the chuck reference key and the contact position recognition key while the plurality of push bars are in contact with the carrier, and configured to perform an operation of determining a position of the carrier on the chuck based on the position of the read chuck reference key and the contact position recognition key.

7. The semiconductor manufacturing apparatus of claim 6, further comprising:
a position detection unit within the carrier position calculation device,
wherein the process of reading the chuck reference key and the contact position recognition key comprises:
recognizing images of the chuck reference key and the contact position recognition key by comparing a shape of the chuck reference key and the contact position recognition key in the obtained images with standard shapes of recognition keys and contact position recognition key that is stored in a position detection unit;
adjusting a center point of the shape of the chuck reference key of the obtained images to a fixed position; and
adjusting a center point of the shape of the contact position recognition key of the obtained images based on the adjusted center point of the shape of the chuck reference key of the obtained images, which determines the position of the contact position recognition key.

8. The semiconductor manufacturing apparatus of claim 1, wherein the bonding head comprises a bonding head reference key disposed at a position that faces the chuck.

9. The semiconductor manufacturing apparatus of claim 8, wherein the camera is configured to obtain images of the chuck reference key and the bonding head reference key between the chuck and the bonding head.

10. A method of reading a position of a carrier, the method comprising:
providing a chuck including a chuck reference key, the chuck reference key formed at an edge portion thereof;
positioning a carrier on the chuck;
fixing the carrier on the chuck by using a carrier contact device including a contact position recognition key; and
reading the chuck reference key and the contact position recognition key to determine a position of the carrier on the chuck,
wherein fixing the carrier on the chuck comprises:
positioning at least one pair of push bars, each including the contact position recognition key, to face each other at opposite sides with respect to a center of the chuck, the at least one pair of push bars disposed to be spaced apart from the chuck; and
fixing the at least one pair of push bars to the carrier by moving the at least one pair of push bars toward the center of the chuck.

11. The method of claim 10, wherein positioning the at least one pair of push bars comprises disposing two pairs of push bars along a circumference of the chuck, and
wherein each push bar among the two pairs of push bars is disposed along the circumference of the chuck at intervals of 90° with respect to the center of the chuck.

12. The method of claim 10, wherein reading the chuck reference key and the contact position recognition key includes:
obtaining images of the chuck reference key and the contact position recognition key by using a camera while the carrier is fixed; and
reading the chuck reference key and the contact position recognition key from the obtained images.

13. The method of claim 12, wherein determining the position of the carrier includes:
determining a position of the contact position recognition key relative to the position of the chuck reference key by using the read chuck reference key and the contact position recognition key; and
deriving the position of the carrier on the chuck, based on the determined position of the contact position recognition key.

14. A method of attaching a semiconductor die, the method comprising:
positioning a carrier on a chuck including a chuck reference key, the chuck reference key formed at an edge portion thereof;
transferring the semiconductor die to a predetermined position over the chuck reference key by using a bonding head including a bonding head reference key;
obtaining images of the chuck reference key and the bonding head reference key by using a camera;
reading a positional deviation of the bonding head reference key from the chuck reference key at the predetermined position, based on an image data of the images that are obtained by the camera; and
correcting the read positional deviation and attaching the semiconductor die on the carrier,
wherein disposing the carrier on the chuck comprises reading the position of the carrier on the chuck,
wherein reading the position of the carrier comprises:
positioning the carrier on the chuck;
fixing the carrier on the chuck by using a carrier contact device including a contact position recognition key; and
reading the chuck reference key and the contact position recognition key to determine the position of the carrier on the chuck,
wherein fixing the carrier on the chuck comprises:
positioning at least one pair of push bars, each including the contact position recognition key, to face each other at opposite sides with respect to a center of the chuck, the at least one pair of push bars disposed to be spaced apart from the chuck; and
fixing the at least one pair of push bars to the carrier by moving the at least one pair of push bars toward the center of the chuck.

15. The method of claim 14, wherein the chuck reference key includes at least one chuck position recognition key indicating a fixed position on an upper surface of the chuck.

16. The method of claim 15, wherein transferring the semiconductor die to the predetermined position comprises moving the bonding head to a position that is disposed directly over one chuck position recognition key among the at least one chuck position recognition key, and wherein, among the at least one chuck position recognition key, the one chuck position recognition key is located closest to a set attachment position on the carrier to which the semiconductor die is to be attached.

17. The method of claim 14, wherein obtaining images of the chuck reference key and the bonding head reference key includes:

moving the camera between the chuck reference key of the chuck and the bonding head reference key of the bonding head;

photographing the bonding head reference key that is positioned in an upper direction of the camera; and photographing the chuck reference key that is positioned in a lower direction of the camera.

18. The method of claim 14, wherein attaching the semiconductor die to the carrier includes:

correcting the read positional deviation to correct an operation error of the bonding head;

transferring the semiconductor die to a set attachment position over the carrier by using the bonding head for which the operation error is corrected; and attaching the semiconductor die to the set attachment position on the carrier by using the bonding head.

* * * * *